United States Patent [19]

Truitt

[11] Patent Number: 5,023,677
[45] Date of Patent: Jun. 11, 1991

[54] LOW PARASITIC FET TOPOLOGY FOR POWER AND LOW NOISE GAAS FETS

[75] Inventor: George A. Truitt, Allen, Tex.

[73] Assignee: Texas Instruments Incorporated, Dallas, Tex.

[21] Appl. No.: 518,349

[22] Filed: May 2, 1990

[51] Int. Cl.$^5$ .................. H01L 29/80; H01L 23/48; H01L 29/06
[52] U.S. Cl. ................................ 357/22; 357/68; 357/55
[58] Field of Search .............. 357/22, 15, 67, 68, 357/71, 55

[56] References Cited

U.S. PATENT DOCUMENTS

| | | | |
|---|---|---|---|
| 3,969,745 | 7/1976 | Blocker, III | 357/22 |
| 4,298,879 | 11/1981 | Hirano | 357/22 |
| 4,935,805 | 6/1990 | Calviello et al. | 357/15 |

Primary Examiner—Mark Prenty
Attorney, Agent, or Firm—Rene' E. Grossman; Melvin Sharp

[57] ABSTRACT

A gallium arsenide FET having a gate pad with interleaved source and drain regions on two opposing sides of the gate pad, a plurality of gate fingers extending from the gate pad and disposed between each adjacent pair of a source region and a gate region.

20 Claims, 3 Drawing Sheets

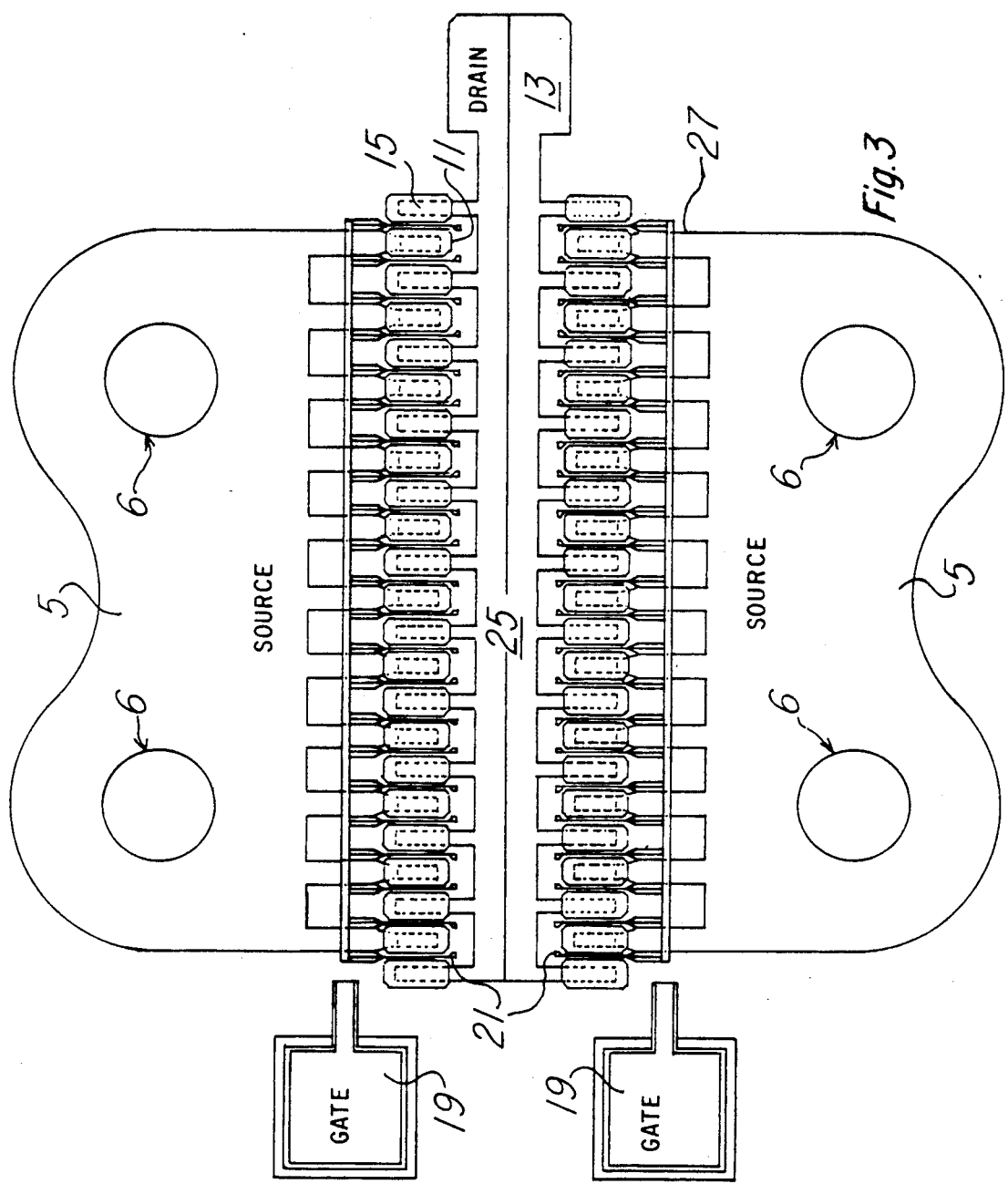

LOW PARASITIC FET TOPOLOGY FOR POWER AND LOW NOISE GAAS FETS

BACKGROUND OF THE INVENTION

1. Field of the Invention

This invention relates to field effect transistors (FETs) and, more specifically, to power and low noise FETs.

1. Brief Description of the Prior Art

Gallium Arsenide (GaAs) FETs are generally formed by providing a substrate of semi-insulating GaAs having a doped region at a surface region thereof with metallization on the doped surface region which makes an ohmic contact with the doped region to form source and drain regions and further metallization on the doped surface region which forms a Schottky barrier diode with the doped region to form the gate region, the channel extending between the source and drain in the doped region of the substrate and under the gate.

The layout topology of the FET and its effect on device performance is an area that is very weakly addressed in the literature. The interdigitated and pi gate feed structures have been industry standards for the last ten years with only minor modifications. The interdigitated FET has served well in low noise and power applications where a large gate periphery is required in a compact form. The pi FET has typically served in low noise designs where a small gate periphery is desired. In the pi configuration, the source is formed as many separate spaced apart segments with the gate being a thin line between the source segments and drain, the gate also including fingers extending therefrom between the source segment. In the interdigitated configuration, both the source and drain are formed as many separate spaced apart segments, the source and drain segments being interleaved or alternating and the gate being a thin line having fingers which extend between each opposing pair of source and drain elements. Both of these topologies limit the size of the FET periphery on MMIC chips and have parasitic components that increase the noise figure and limit the high frequency performance of the FET. The spider FET allows more FET area on the MMIC chip and allows the parasitics to be minimized by its topology.

A standard technique used in prior art FETs to minimize noise and improve gain has been the reduction of gate length. However, a simple reduction of gate length to lower the gate to source capacitance (Cgs) and to improve transconductance (gm) results in a greatly increased gate resistance (Rg) from the thin gate line and very little noise figure reduction.

SUMMARY OF THE INVENTION

In accordance with the present invention, there is provided a GaAs FET which overcomes or minimizes the above noted problems of the prior art. This is accomplished by providing a substantial change in the topology of the source, gate and drain regions over the doped region of the substratre.

Briefly, in accordance with the present invention, there is provided a semi-insulating GaAs substrate having a doped region at a surface thereof. A central gate pad, preferably of layers of titanium, platinum and gold (Ti/Pt/Au) in that order, having a plurality of fingers extending therefrom is disposed over the doped region and forms a Schottky diode therewith. On opposing sides of said gate pad and over the doped region are disposed alternate source and drain regions with the fingers from the central gate pad extending between each adjacent source and drain pair. The source regions on one side of the gate pad region are coupled to a first source pad and the source regions on the other side of the gate pad region are coupled to a second source pad. The drain regions are all coupled to a drain pad, preferably via a air bridge over the source regions. The source and drain pads can be over the doped region, but need not be. The source and drain pads and regions make an ohmic contact with the substrate thereunder and are preferably a gold-germanium (Au-Ge) alloy. The gate fingers are preferably offset toward the source. The source pads optionally include a via therein extending to the underside of the substrate and having a conductor, preferably of gold (Au) extending from the source pad along the via to the backside of the substrate for connecting the source pad to a ground plane, connecting plural source pads together or for connection to other circuitry at or by way of the underside of the substrate. The result is an FET having a gate structure in the shape of a spider.

The FET topology of the present invention achieves lower minimum noise figure (Fmins) in a more compact structure than either the pi-gate or interdigitated FETs and provides many more gate feeds than are available with the prior art topologies without increasing the gate pad area to reduce gate resistance. The improved FET performance in accordance with the present invention is achieved by reducing the gate feed resistance and minimizing the parasitic gate to source capacitance in the region of the gate feed.

The importance of the parasitic components is demonstrated by H. Fukui in "Design of Microwave GaAs MESFETs for Broad-Band Low-Noise Amplifiers", IEEE Trans. Microwave Theory Tech., Vol>MTT-27, pp. 643-450 July, 1979 and Addendum to "Design of Microwave GaAs MESFETs for Broad-Band Low-Noise Amplifiers", IEEE Trans. Microwave Theory Tech., Vol. MTT-29, pp. 1119, Oct., 1981. Fukui demonstrates the importance of the parasitic components Rs, Rg and Cgs. Rg and Rs degrade the minimum noise figure with equal weight. It is therefore apparent that any topological changes that reduce Rs and Rg cannot occur at the expense of increased Cgs. Rs is typically reduced in FET structures by offsetting the gate in the channel region toward the source. Increasing the number of gate feeds and thus reducing the gate finger width lowers the gate resistance of FETs. Multiple gate feeds however tend to increase gate capacitance due to the increased area of the gate bond pad, the gate feeds and gate flags. Gate flags are a short section of wider gate line at the end of each gate finger and are used to prevent the gate from curling up on itself. These gate flags increase the parasitic capacitance of the device, especially when placed on active GaAs. Isolation implantation allows the gate flag to be placed on inactive GaAs, thus reducing the parasitic effects of the flag.

The gate bond pad of the FET also contributes to parasitic gate capacitance and, for the FET in accordance with the present invention, is of minimum producible dimensions. The FET topology in accordance with the present invention also makes effective use of the gate bond bad by combining it with the gate feeds. This allows the gate feeds to be plated to reduce gate feed resistance.

The combination of the drain regions, drain air bridges and drain pad form a "U-shaped" stub wherein oscillations can be set up at certain frequencies, depending upon dimensions and other conditions. These oscillations may be undesirable and can be eliminated by providing a conductive strap across the open end of the "U".

The above described topology allows larger devices to be implemented in substantially the same area. The gate feed structure incorporates the gate pad to minimize parasitics. In addition, the topology of the subject invention reduces the gate resistance by offering a plated gate feed and a large number of gate feeds, while minimizing the parasitics. These advantages are achieved by an increase in the output capacitance (Cds). The source to gate capacitance does not directly affect the noise figure of the FET.

BRIEF DESCRIPTION OF THE DRAWINGS

FIG. 3 is a top view of a second embodiment of a device in accordance with the present invention.

DESCRIPTION OF THE PREFERRED EMBODIMENTS

Figure 1:
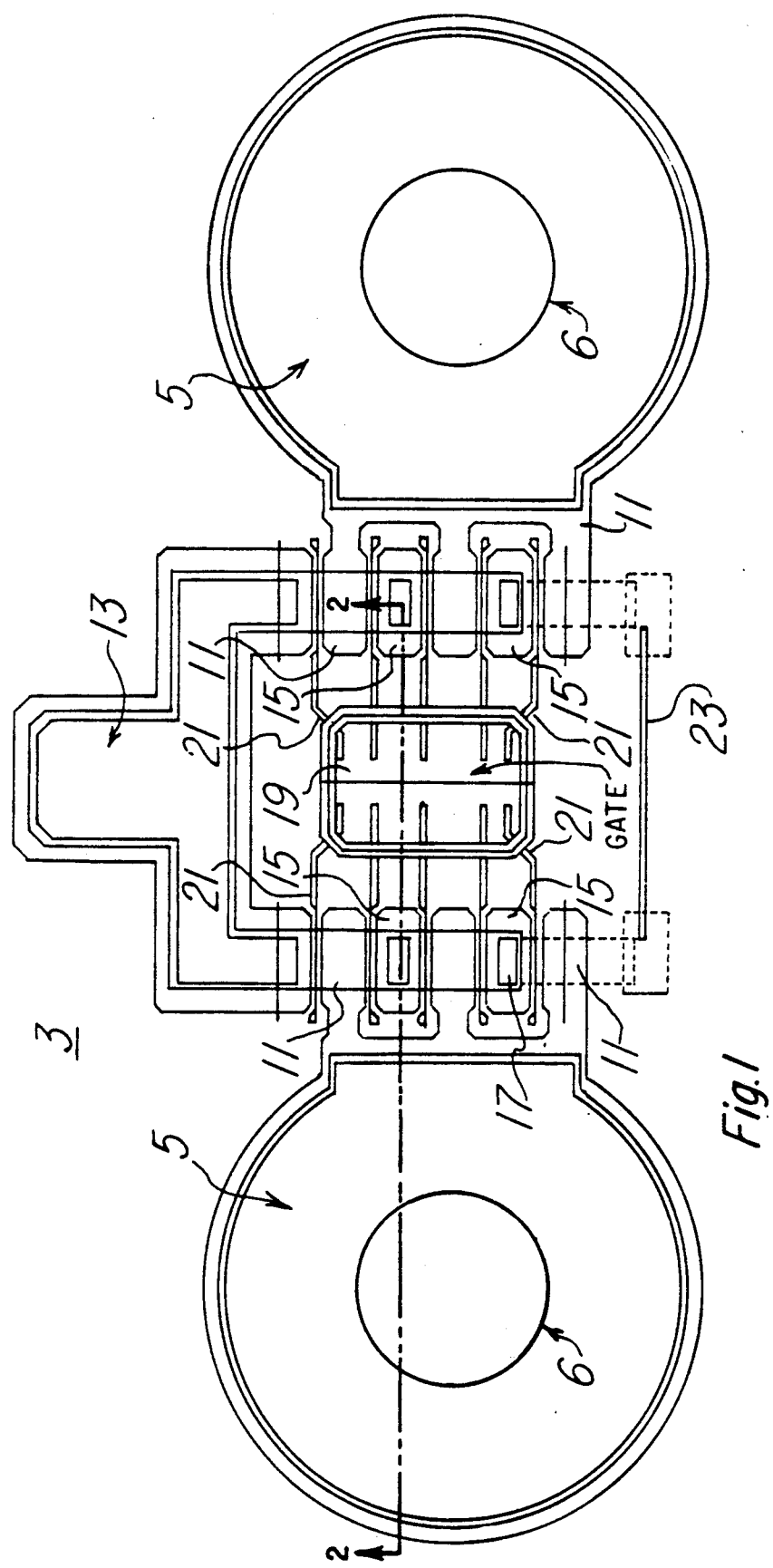
FIG. 1 is a top view of an FET device in accordance with a first embodiment of the present invention.
Figure 2:
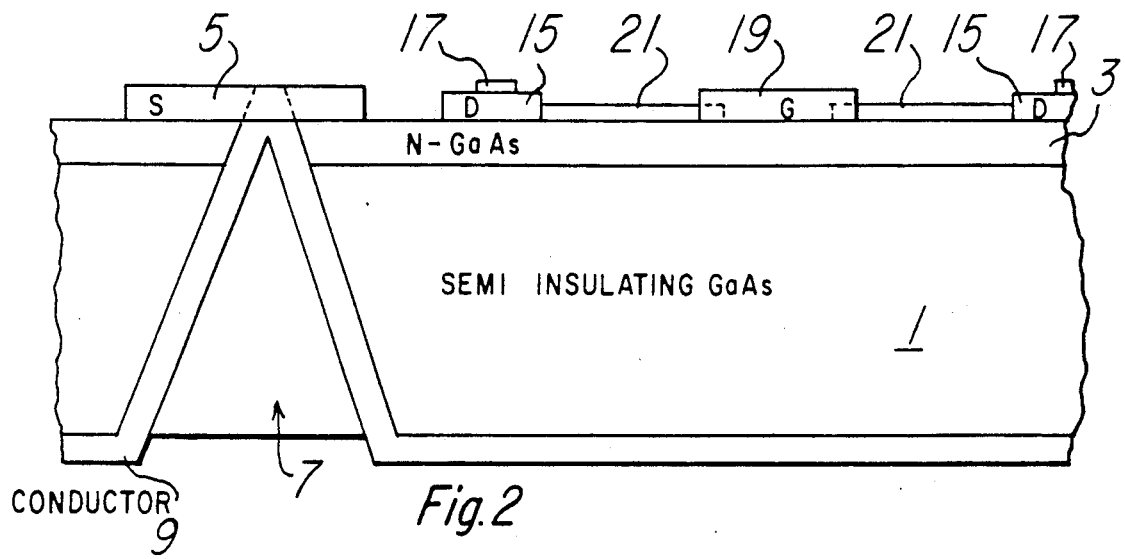
FIG. 2 is a cross-section taken along the line 2—2 of FIG. 1.

Referring first to FIGS. 1 and 2, there is shown a first embodiment of a GaAs FET structure in accordance with the present invention. The structure includes a semi-insulating GaAs substrate 1 having a surface region 3 which is doped N-type, preferably with silicon. A source pad 5 of electrically conductive material, preferably a gold-germanium (Au-Ge) alloy, which makes ohmic contact with the doped region 3 is disposed over a portion of the region 3 and includes an aperture 6 therein which conforms with a via 7 in and extending through the substrate. A conductor 9, preferably of gold, is optionally disposed in the via and extends therethrough from the source pad 5 to the underside of the substrate 1 to connect the source pad to other regions either on or in the substrate or external to the substrate. A plurality of source regions 11 identical to the source pad 5 in construction extend from the source pad and are spaced apart. A drain pad 13 of electrically conductive material, preferably the same gold-germanium alloy as used to form the source pad 5, which makes ohmic contact with the doped region 3 is disposed over a portion of the region 3 spaced from the source pad 5. A plurality of drain regions 15 identical to the drain pad 13 in construction are interleaVed between the source regions 11 and are coupled to the drain pad 13 via an air bridge 17. As can be seen in FIG. 1, identical source and drain structures are provided on opposite sides of the gate pad 19, the structure being symmetrical relative to a line drawn through the center of the gate pad and the drain pad. The gate pad 19 is formed of electrically conductive material, preferably plural layers of titanium and gold in that order from the substrate 1. A plurality of electrically conductive fingers 21 are coupled to the gate pad 19 and extend between each opposing pair of a source region 11 and a drain region 15. It can be seen that the structure of the gate pad 19 with its fingers 21 takes the shape of a spider or the like.

As a further embodiment of the structure of FIGS. 1 and 2, it can be seen that the drain pad 13, drain regions 15 and air bridge 17 form a U-shaped structure. This physical arrangements can cause oscillations at high frequencies, the particular frequency of oscillation being dependent upon various physical factors which are well known. In the event these oscillations become undesirable, they are eliminated or minimized by providing a strap 23 which couples together the two remote drain regions 15 at the far ends of the "U" to provide a continuous electrically conductive loop.

Referring now to FIG. 3, there is shown a second embodiment of the present invention which is a power FET and wherein like numbers r©present the same or similar structure to that of FIGURES i and 2 In this embodiment, there is provided a pair of source pads 5 having source regions 11 extending therefrom and a drain pad 13 having a portion 25 thereof extending between the two rows of source regions. The drain regions 15 extend from the drain portion 25 and are interleaved between the source regions 11. Two gate pads 19 are provided for providing two different gate structures. It should be understood that the gate pads 19 could be coupled together or be provided as a single gate pad, if appropriate. A plurality of gate fingers 21 are positioned between opposing source regions 11 and drain regions 15 as in the embodiment of FIGURES I and 2. However, in this embodiment, the source regions 11 are coupled together and to the source pad 5 via an air bridge 27.

Figure 4:
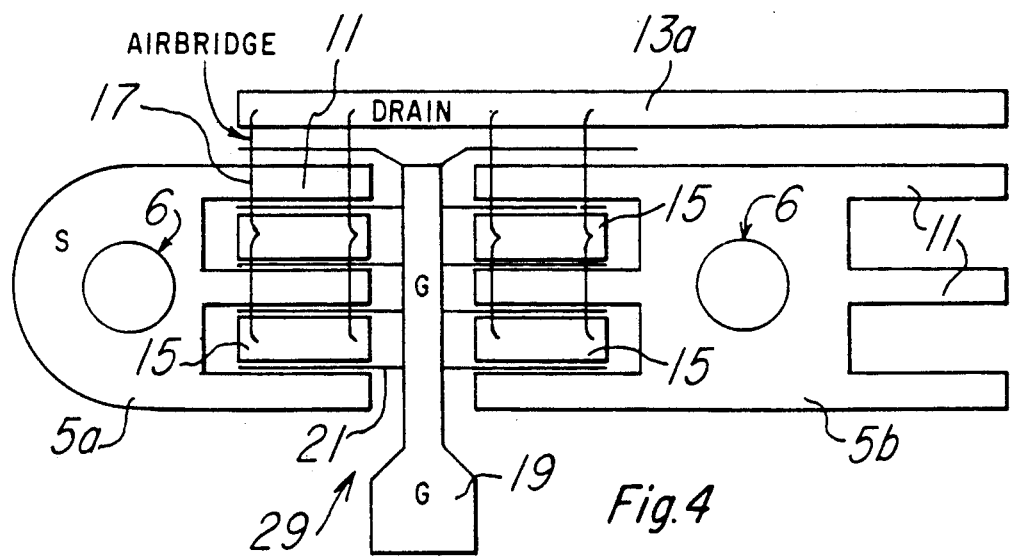
FIG. 4 is a top view of a third embodiment of a device in accordance with the present invention.

Referring now to FIG. 4, there is shown a third embodiment in accordance with the present invention. This embodiment is identical to the embodiment of FIGS. 1 and 2 except that each of the source pads 5 except the two end source pads 5a of the structure is coupled to source regions 11 on both opposing sides thereof as shown in source region 5b with one via 7 in each of the source pads. The drain pad 13a is elongated so that it can be coupled to drain regions 15 at two or more banks 29 of drain regions wherein a bank is defined as one grouping of gate, source and drain components between an adjacent pair of vias as seen in FIG. 4. It is also apparent that there can be plural gate pads 19, one for each bank 29 or the gate pad could be elongated in the same manner as the drain pad 13a to provide an interconnected gate structure.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:
1. A FET comprising:
   (a) a substrate having an active region at a surface thereof;
   (b) a gate pad disposed on said active region;
   (c) a plurality of gate fingers coupled to said gate pad, some of said gate fingers extending from said gate pad in opposite directions;
   (d) a plurality of interleaved source contacts and drain contacts disposed on said active region and making an ohmic contact with said active region, at least some of said gate fingers disposed between an adjacent pair of contacts, one of said contacts being a source contact and the other of said contacts being a drain contact and

(e) an air bridge coupling together predetermined ones of one of said source contacts and said drain contacts, said air bridge extending over the other of said source contacts and said drain contacts adjacent to said predetermined ones of one of said source and drain contacts.

2. A FET as set forth in claim 1 wherein said gate pad provides a Schottky diode with said active region.

3. A FET as set forth in claim 1 wherein said gate pad is composed of layers of titanium, platinum and gold in that order extending away from said substrate.

4. A FET as set forth in claim 1 wherein said substrate is a group III-V semiconductor material.

5. A FET as set forth in claim 1 wherein said substrate is gallium arsenide.

6. A FET as set forth in claim 2 wherein said substrate is gallium arsenide.

7. A FET as set forth in claim 3 wherein said substrate is gallium arsenide.

8. A FET as set forth in claim 2 wherein said source and drain contacts are a gold-germanium alloy.

9. A FET as set forth in claim 3 wherein said source and drain contacts are a gold-germanium alloy.

10. A FET as set forth in claim 4 wherein said source and drain contacts are a gold-germanium alloy.

11. A FET as set forth in claim 7 wherein said source and drain contacts are a gold-germanium alloy.

12. A FET as set forth in claim 1 further including a source pad coupled to said source contacts, a via extending through said substrate and extending to said source pad, an electrical conductor disposed in said via, contacting said source pad and extending out of the end of said via remote from said source pad and a drain pad coupled to said drain contacts.

13. A FET as set forth in claim 2 further including a source pad coupled to said source contacts, a via extending through said substrate and extending to said source pad, an electrical conductor disposed in said via, contacting said source pad and extending out of the end of said via remote from said source pad and a drain pad coupled to said drain contacts.

14. A FET as set forth in claim 6 further including a source pad coupled to said source contacts, a via extending through said substrate and extending to said source pad, an electrical conductor disposed in said via, contacting said source pad and extending out of the end of said via remote ,from said source pad and a drain pad coupled to said drain contacts.

15. A FET as set forth in claim 8 further including a source pad coupled to said source contacts, a via extending through said substrate and extending to said source pad, an electrical conductor disposed in said via, contacting said source pad and extending out of the end of said via remote from said source pad and a drain pad coupled to said drain contacts.

16. A FET as set forth in claim 12, wherein said drain pad and said drain contacts form a U-shape, further including an electrically conductive strap coupled across the open end of said "U".

17. A FET as set forth in claim 13, wherein said drain pad and drain contacts form a U-shape, further including an electrically conductive strap coupled across the open end of said "U".

18. A FET as set forth in claim 14, wherein said drain pad and drain contacts form a U-shape, further including an electrically conductive strap coupled across the open end of said "U".

19. A FET as set forth in claim 15, wherein said drain pad and drain contacts form a U-shape, further including an electrically conductive strap coupled across the open end of said "U".

20. A FET comprising:

(a) a substrate having an active region at a surface thereof;

(b) a plurality of interleaved source contacts and drain contacts disposed on said active region and making an ohmic contact with said active region;

(c) a gate disposed on said active region coextensive with said plurality of interleaved source and drain contacts; and (d) a plurality of gate fingers coupled to said gate, some of said gate fingers extending from said gate pad in opposite directions, at least some of said gate fingers disposed between adjacent pairs of contacts, one of each said pair of contacts being a source contact and the other of said contacts being a drain contact.

* * * * *